United States Patent
Chen et al.

(10) Patent No.: US 12,029,007 B2
(45) Date of Patent: Jul. 2, 2024

(54) COOLING SYSTEM AND COOLING DEVICE

(71) Applicant: Wistron Corporation, New Taipei (TW)

(72) Inventors: Hua Chen, New Taipei (TW); Sheng-Yen Lin, New Taipei (TW); Chuan-Yi Liang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 171 days.

(21) Appl. No.: 17/569,665

(22) Filed: Jan. 6, 2022

(65) Prior Publication Data
US 2023/0070604 A1    Mar. 9, 2023

(30) Foreign Application Priority Data
Sep. 9, 2021 (TW) ................. 110133659

(51) Int. Cl.
*H05K 7/20* (2006.01)

(52) U.S. Cl.
CPC ..... *H05K 7/20263* (2013.01); *H05K 7/20236* (2013.01); *H05K 7/20272* (2013.01); *H05K 7/20409* (2013.01); *H05K 7/20772* (2013.01)

(58) Field of Classification Search
CPC ........... H05K 7/20263; H05K 7/20154; H05K 7/20409; H05K 7/20772; H05K 7/20727
See application file for complete search history.

(56) References Cited

U.S. PATENT DOCUMENTS

| | | | |
|---|---|---|---|
| 9,818,457 B1* | 11/2017 | Querbach | ................. G06F 1/18 |
| 2013/0181585 A1* | 7/2013 | Zhu | ................... H05K 7/20254 |
| | | | 312/236 |
| 2018/0095909 A1* | 4/2018 | Querbach | ................. G06F 1/18 |

OTHER PUBLICATIONS

European Search Report dated Oct. 5, 2022, listed in related European patent application No. 22 164 433.9.

* cited by examiner

*Primary Examiner* — Lionel Nouketcha
(74) *Attorney, Agent, or Firm* — McClure, Qualey & Rodack, LLP

(57) ABSTRACT

A cooling system and a cooling device are provided. The cooling device includes a container, a heat dissipation module, and a cooling module. The cooling module includes a cover plate and a heat dissipation fin assembly. The cover plate covers an opening of the container. The cover plate includes a cooling channel. The cooling channel is arranged in the cover plate and includes an inlet and an outlet. The inlet and the outlet are respectively located at two sides of the cover plate. One side of the heat dissipation fin assembly is in contact with a surface of the cover plate, and an other side of the heat dissipation fin assembly is located in the container. Through the above structure, a usage amount of heat transfer fluid injected into the container of the cooling device is lower than that of a conventional immersion cooling device.

20 Claims, 11 Drawing Sheets

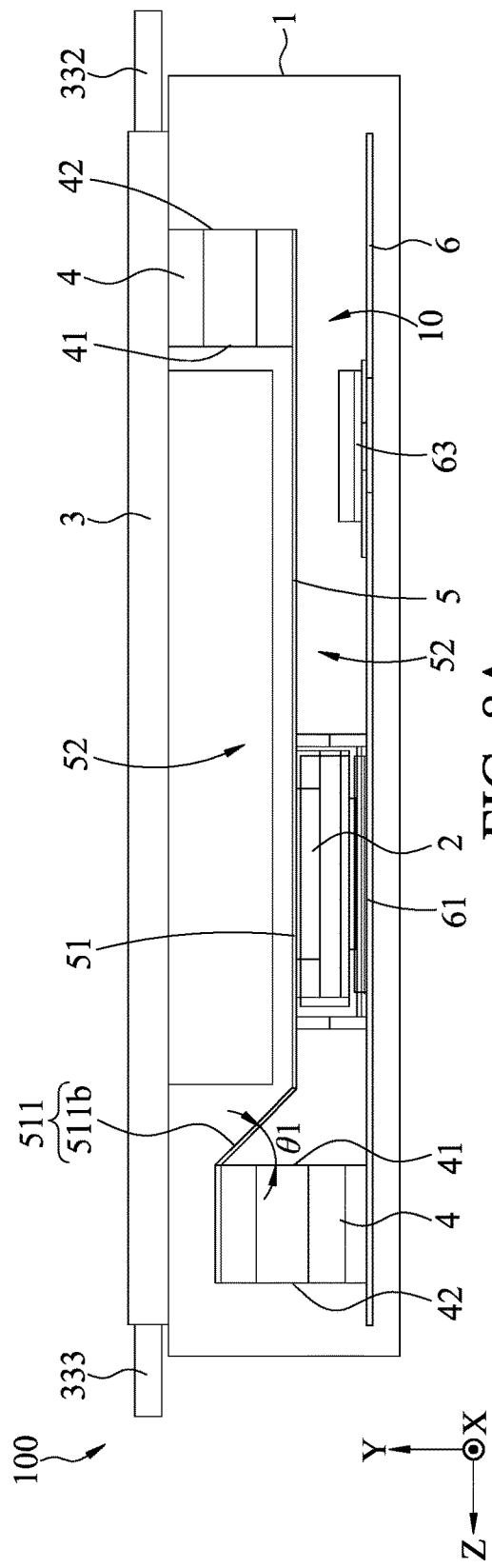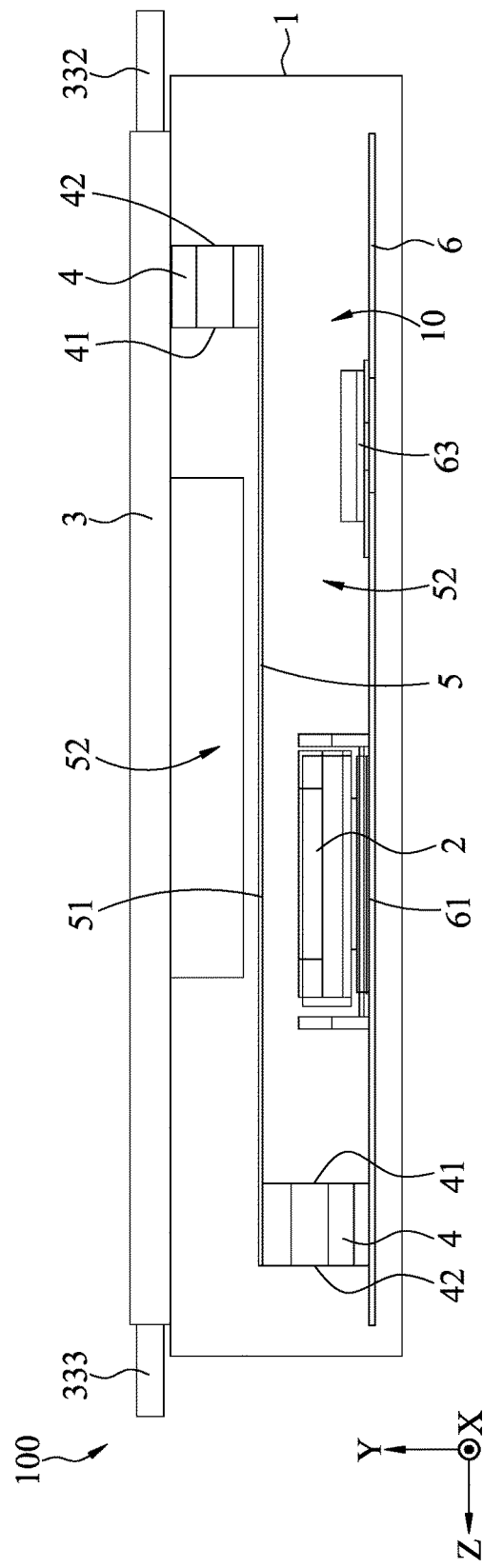

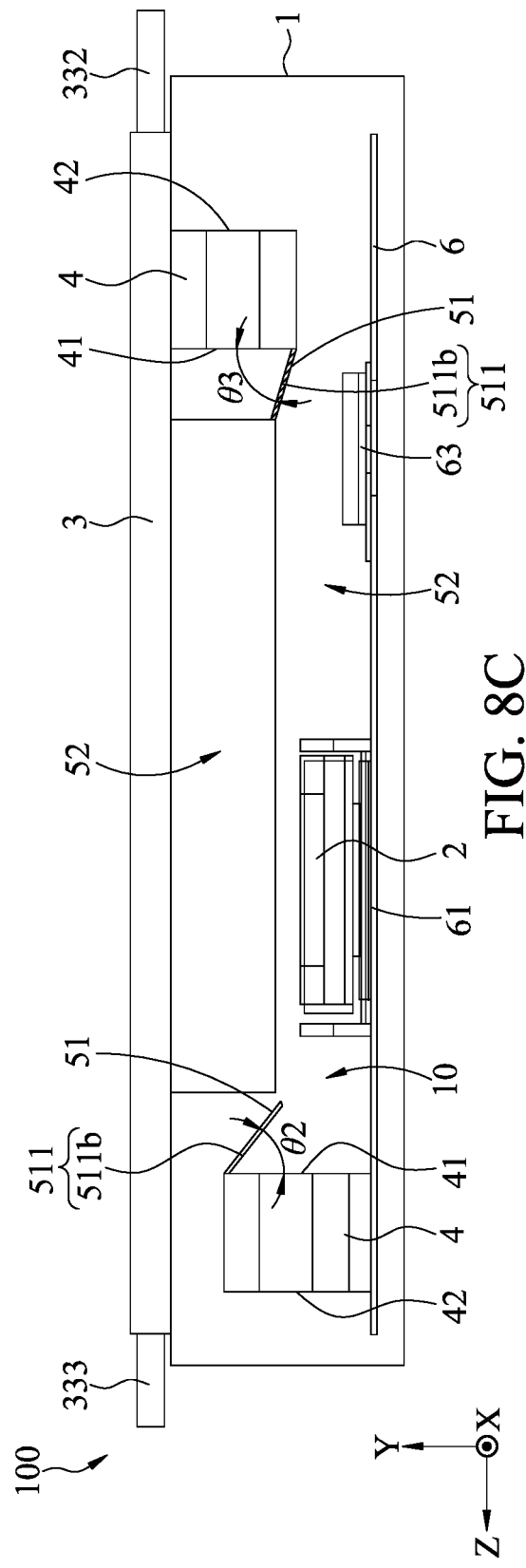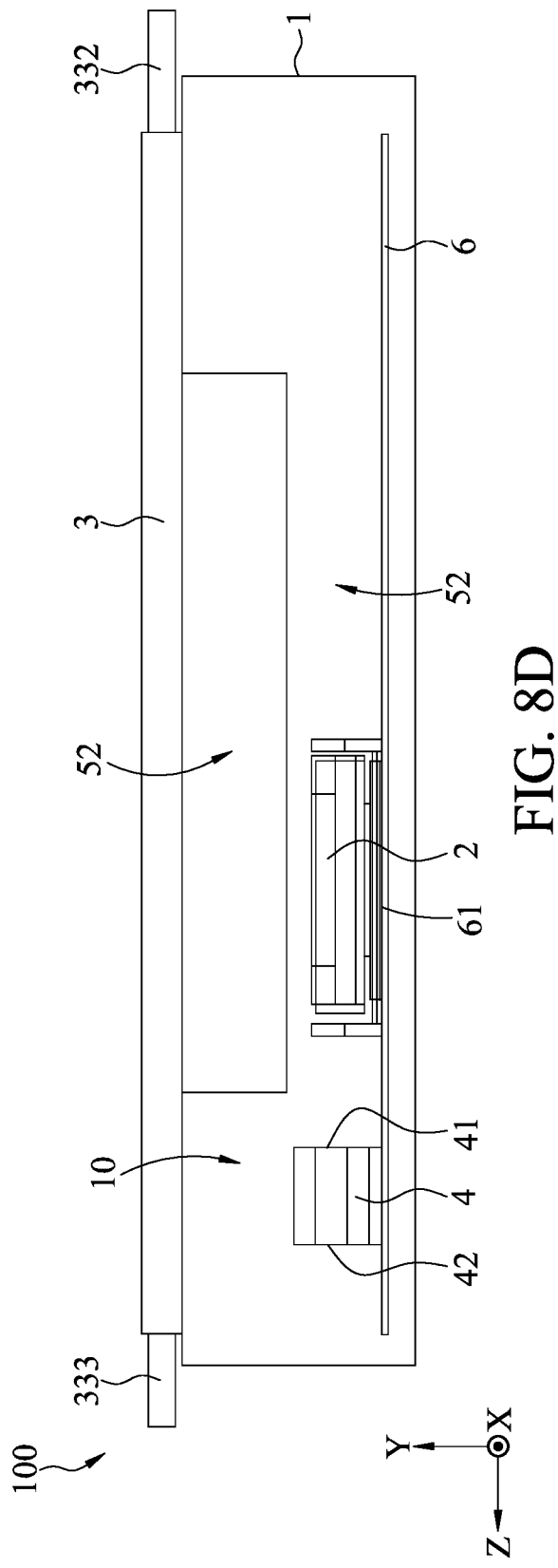

COOLING SYSTEM AND COOLING DEVICE

CROSS-REFERENCE TO RELATED APPLICATION

This non-provisional application claims priority under 35 U.S.C. § 119(a) to Patent Application No. 110133659 filed in Taiwan, R.O.C. on Sep. 9, 2021, the entire contents of which are hereby incorporated by reference.

BACKGROUND

Technical Field

The present disclosure relates to a cooling system, and in particular, to a cooling system and device.

Related Art

With the rapid development of performance of servers, the servers generate a large amount of heat energy during operation. To avoid poor operational performance of the servers resulting from accumulation of the heat energy, main boards in the servers are generally immersed in heat dissipation liquid, heat energy generated by heating components on the main boards is absorbed by the heat dissipation liquid, and is circulated to outsides of box bodies of the servers through the heat dissipation liquid, to exchange heat with water or air. Such a heat exchange manner requires a large amount of heat dissipation liquid, and is likely to cause leakage during entering and exiting the box bodies.

SUMMARY

According to some embodiments, a cooling system includes a container, heat transfer fluid, a heat dissipation module, and a cooling module. The container includes an opening. The heat transfer fluid is located in the container. The heat dissipation module is located in the container. The cooling module includes a cover plate and a heat dissipation fin assembly, where the cover plate covers the opening, the cover plate includes a cooling channel, the cooling channel are arranged in the cover plate, the cooling channel includes an inlet and an outlet. One side of the heat dissipation fin assembly is in contact with the cover plate, and an other side of the heat dissipation fin assembly is located in the container.

In some embodiments, the cooling system further includes a fluid conveying device, where an outlet of the fluid conveying device faces the heat dissipation module, and fluid generated at the outlet of the fluid conveying device flows to the heat dissipation module.

In some embodiments, the cooling system further includes a guiding member, where the guiding member is located in the container, the guiding member includes a guiding plate. The guiding plate divides the inside of the container into two separated regions. The fluid conveying device is positioned on the guiding plate. The guiding plate separates the heat dissipation module and the heat dissipation fin assembly. The heat dissipation module and the heat dissipation fin assembly are respectively located in the separated regions. The heat transfer fluid in the separated regions is conveyed in opposite flow directions.

In some embodiments, the guiding plate includes a turning portion, where the turning portion is adjacently located at the outlet of the fluid conveying device.

In some embodiments, the turning portion is an upright flat plate. The upright flat plate is parallel to a surface of the fluid conveying device; or the turning portion is an inclined flat plate. There is an angle between the inclined flat plate and the surface of the fluid conveying device, and the angle is less than 90 degrees.

In some embodiments, the cooling system further includes a plurality of fluid conveying devices, where the fluid conveying devices form two groups opposite to each other and are arranged at two sides of the inside of the container. Outlets of the fluid conveying devices face the heat dissipation module and the heat dissipation fin assembly respectively. Flow directions of fluid generated at the outlets of the fluid conveying devices are respectively conveying the fluid to the heat dissipation module and the heat dissipation fin assembly.

In some embodiments, the cooling system further includes a plurality of heat dissipation modules, where outlets of the fluid conveying devices respectively face the heat dissipation modules, and the heat transfer fluid is guided to the heat dissipation modules.

In some embodiments, the guiding member includes a plurality of guiding plates, where the guiding plates are adjacently located at the outlets of the fluid conveying devices respectively. The guiding plates are used for respectively guiding the heat transfer fluid conveyed by the fluid conveying devices to the heat dissipation modules and the heat dissipation fin assembly. The guiding plates are inclined flat plates. There are angles respectively between the inclined flat plates and surfaces of the fluid conveying devices. Each of the angles is less than 90 degrees, and the angles of the guiding plates are the same or different.

In some embodiments, the cooling system further includes a circuit board and a plurality of electronic components, where the electronic components are disposed on the circuit board, the circuit board is located in the container. The heat dissipation modules are respectively combined with the electronic components.

In some embodiments, the cooling system further includes a circuit board and a CPU (central processing unit), where the CPU is disposed on the circuit board. The circuit board is located in the container. The heat dissipation module is combined with the CPU.

In some embodiments, the cooling system further includes a plurality of expansion components, where the expansion components are disposed on the circuit board and located at sides of the CPU.

In some embodiments, the heat dissipation module includes a base and a plurality of heat dissipation fins. The heat dissipation fins are located on the base. The base includes a plurality of baffles. The baffles are respectively located at two sides of the plurality of heat dissipation fins. A thickness of each of the baffles is greater than a thickness of each of the heat dissipation fins. The base and the heat dissipation fins are an integrated one-piece member or two separate members.

In some embodiments, the base includes a plurality of locking members, where the heat dissipation fins are arranged on the base in a cross shape. The locking members are locked around the plurality of heat dissipation fins and are fastened to the circuit board.

In some embodiments, a range of a thickness of each of the heat dissipation fins is 0.8 mm to 1.2 mm. A range of a distance between heat dissipation fins is 2.8 mm to 3.6 mm.

In some embodiments, directions of a long side of each of the heat dissipation fins and a long side of the heat dissipation fin assembly are parallel to a guiding direction of the heat transfer fluid. Heat transfer fluid passes through between the heat dissipation fins and the heat dissipation fin assembly in a forward direction.

In some embodiments, the cooling channel includes a flow channel. The flow channel is arranged in the cover plate in a consecutive S-shaped manner. The inlet and the outlet are respectively located at two sides of the cover plate, The inlet is located at one side of the cover plate and connected to the flow channel. The outlet is located at an other side of the cover plate and connected to the flow channel.

According to some embodiments, a cooling device includes a container, adapted to accommodate heat transfer fluid. The container includes an opening. The heat transfer fluid is located in the container. The heat dissipation module is located in the container. The cooling module includes a cover plate and a heat dissipation fin assembly, where the cover plate covers the opening. The cover plate includes a cooling channel. The cooling channel is arranged in the cover plate, the cooling channel includes an inlet and an outlet. One side of the heat dissipation fin assembly is in contact with the cover plate, and an other side of the heat dissipation fin assembly is located in the container.

In conclusion, according to some embodiments, the cooling module covers the opening of the container, the heat transfer fluid exchanges heat in the container through the cover plate and the heat dissipation fin assembly of the cooling module, and the heat transfer fluid exchanges heat with air or water without passing through the outside of the container. Therefore, a usage amount of the heat transfer fluid in the container can be relatively reduced compared to a usage amount of the conventional manner in which the heat transfer fluid needs to be conveyed to the outside of the container.

BRIEF DESCRIPTION OF THE DRAWINGS

FIG. 8A illustrates a schematic cross-sectional side view of a cooling system from the perspective of FIG. 6 according to some embodiments, which shows a state in which a turning portion of a guiding plate is an inclined plate;

FIG. 8B illustrates a schematic cross-sectional side view of a cooling system from the perspective of FIG. 6 according to some embodiments, which shows a state in which a guiding plate is a flat plate;

FIG. 8C illustrates a schematic cross-sectional side view of a cooling system from the perspective of FIG. 6 according to some embodiments, which shows a state in which a plurality of guiding plates are inclined flat plates;

FIG. 8D illustrates a schematic cross-sectional side view of a cooling system from the perspective of FIG. 6 according to some embodiments, which shows a state in which no guiding plate is used;

DETAILED DESCRIPTION

Figure 1:
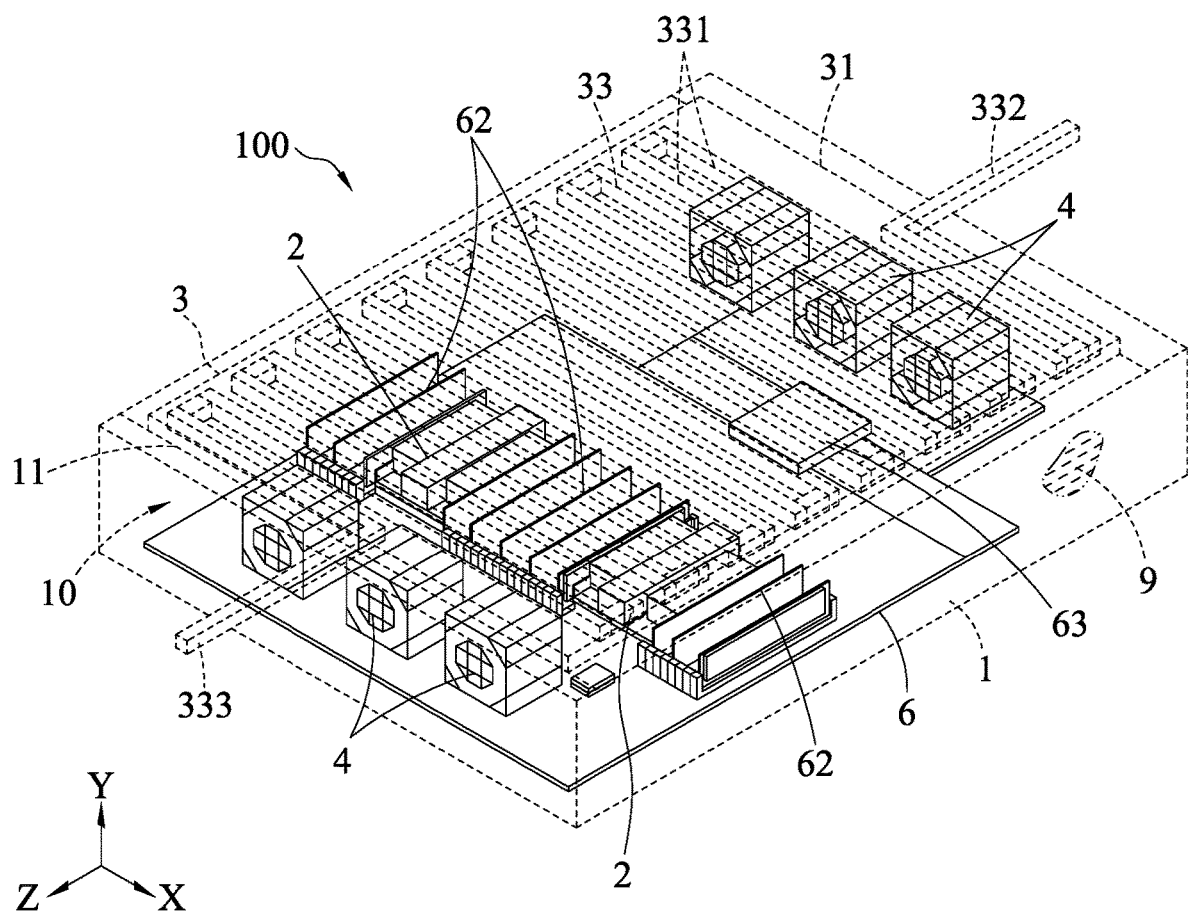
FIG. 1 illustrates a schematic outside view of a cooling system according to some embodiments, where a container and a cooling module are represented by dashed lines, a guiding member is not drawn, a circuit enclosed by imaginary lines represented by two-dot chain lines shows a heat transfer fluid in the container in a perspective manner, and there are electronic components below heat dissipation modules.
Figure 2:
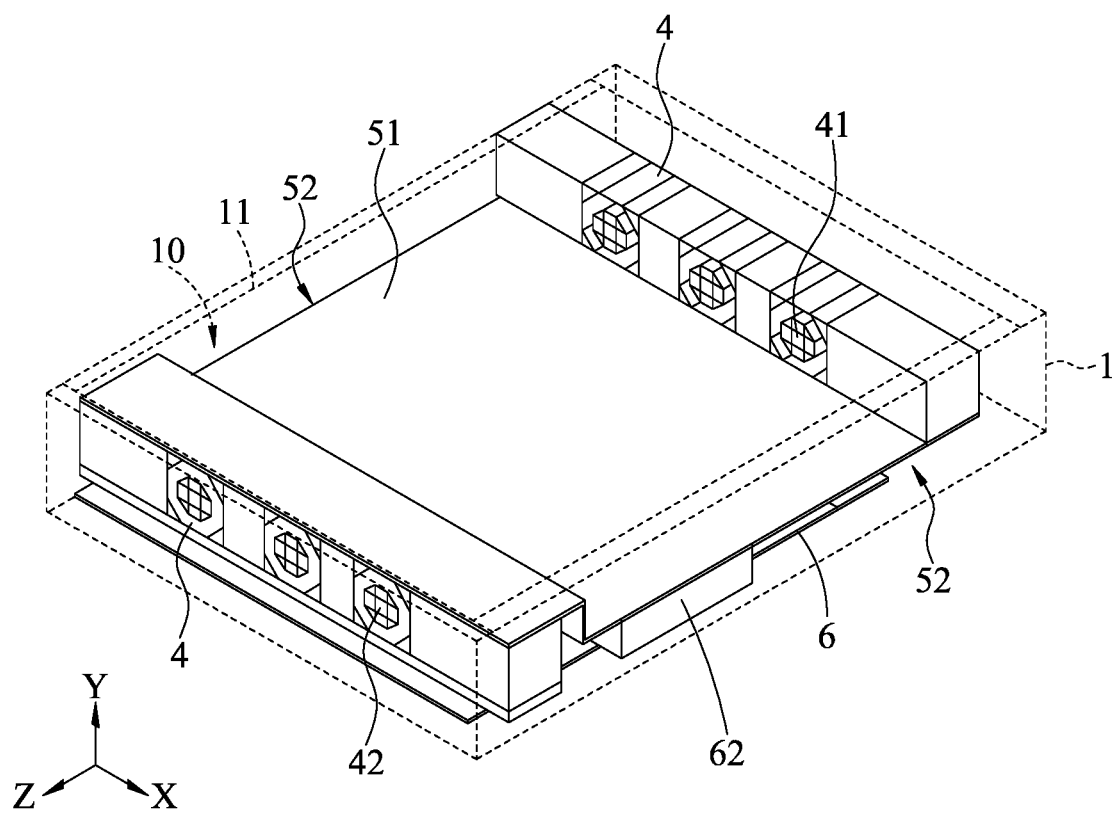
FIG. 2 illustrates a schematic outside view of a cooling system according to some embodiments, a container is represented by dashed lines, a guiding member is drawn and covers a fluid conveying device, and a cooling module and heat transfer fluid are not drawn.
Figure 6:
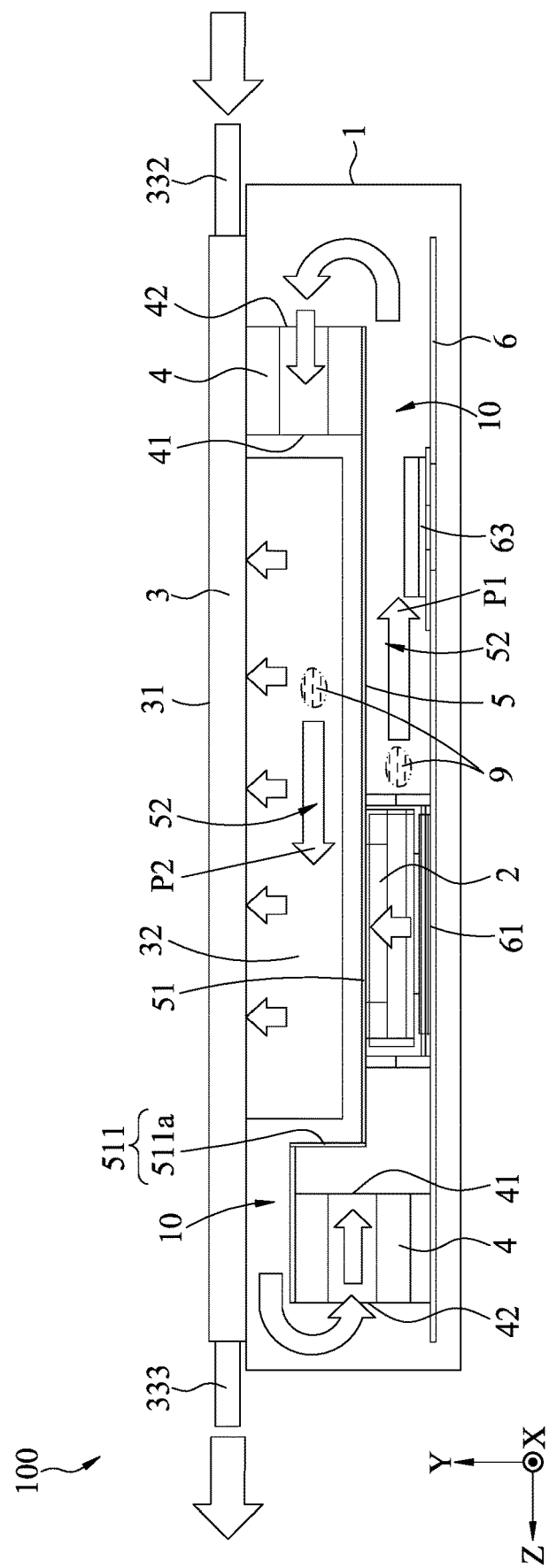
FIG. 6 illustrates a schematic cross-sectional side view of a position 6-6 indicated in FIG. 5, where a circuit enclosed by imaginary lines represented by two-dot chain lines show local heat transfer fluid in the container, and states of a flow direction of fluid generated during operation of fluid conveying devices and water inlet and outlet directions of a cover plate are indicated by arrows.

Referring to FIG. 1 and FIG. 2, FIG. 1 is a schematic outside view of a cooling system, where a container 1 and a cooling module 3 are represented by dashed lines, a guiding member 5 is not drawn, a circuit enclosed by imaginary lines represented by two-dot chain lines show a heat transfer fluid 9 in the container in a perspective manner 1, and there are electronic components 61 (as shown in FIG. 6) below heat dissipation modules 2; and FIG. 2 is a schematic outside view of a cooling system, where a container 1 is represented by dashed lines, a guiding member 5 is drawn and covers around a fluid conveying device 4, and a cooling module 3 and a heat transfer fluid 9 not are not drawn. In some embodiments, the heat transfer fluid 9 is cooling coolant and the heat dissipation modules 2 is a heat sink. In some embodiments, the cooling system includes a cooling device 100. The cooling device 100 includes a container 1, a heat dissipation module 2, and a cooling module 3. The container 1 includes an opening 11 for communicating an inside of the container 1 (described as an accommodating space 10 below) with an outside of the container 1. The heat dissipation module 2 is located in the accommodating space 10. The cooling module 3 includes a cover plate 31 and a heat dissipation fin assembly 32. In some embodiments, the cover plate 31 is a cooling plate. The cover plate 31 covers the opening 11, the cover plate 31 includes a cooling channel 33 (which is a waterway channel). The cooling channel 33 is arranged in the cover plate 31. The cooling channel 33 includes an inlet and an outlet. The inlet and the outlet are respectively located at two sides of the cover plate 31. One side of the heat dissipation fin assembly 32 is in contact with the cover plate 31, and an other side of the heat dissipation fin assembly 32 is located in the accommodating space 10 (as shown in FIG. 6).

In some embodiments, the cooling device 100 is adapted to accommodate the heat transfer fluid 9. The heat transfer fluid 9 is a non-conductor. The heat transfer fluid 9 is located in the accommodating space 10 of the container 1 of the cooling device 100.

After the inside of the container 1 is filled with the heat transfer fluid 9, the cooling module 3 covers and seals the opening 11 of the container 1, so that the container 1 is combined with the cooling module 3 to form a closed container. The heat dissipation modules 2 in the container 1 and the heat dissipation fin assembly 32 of the cooling module 3 are immersed in the heat transfer fluid 9, so that the heat transfer fluid 9 exchanges heat in the container 1 through the cover plate 31 and the heat dissipation fin assembly 32. The heat transfer fluid 9 exchanges heat with air or water without passing through the outside of the container 1. Therefore, a usage amount of the heat transfer fluid 9 in the container 1 is relatively reduced compared with a usage amount of a conventional method in which the heat transfer fluid 9 needs to be conveyed to the outside of the container 1, so that leakage loss and evaporation resulting from that the heat transfer fluid 9 is conveyed to a pipeline of the outside of the container 1 is reduced, and device operation costs are reduced.

Figure 3A:
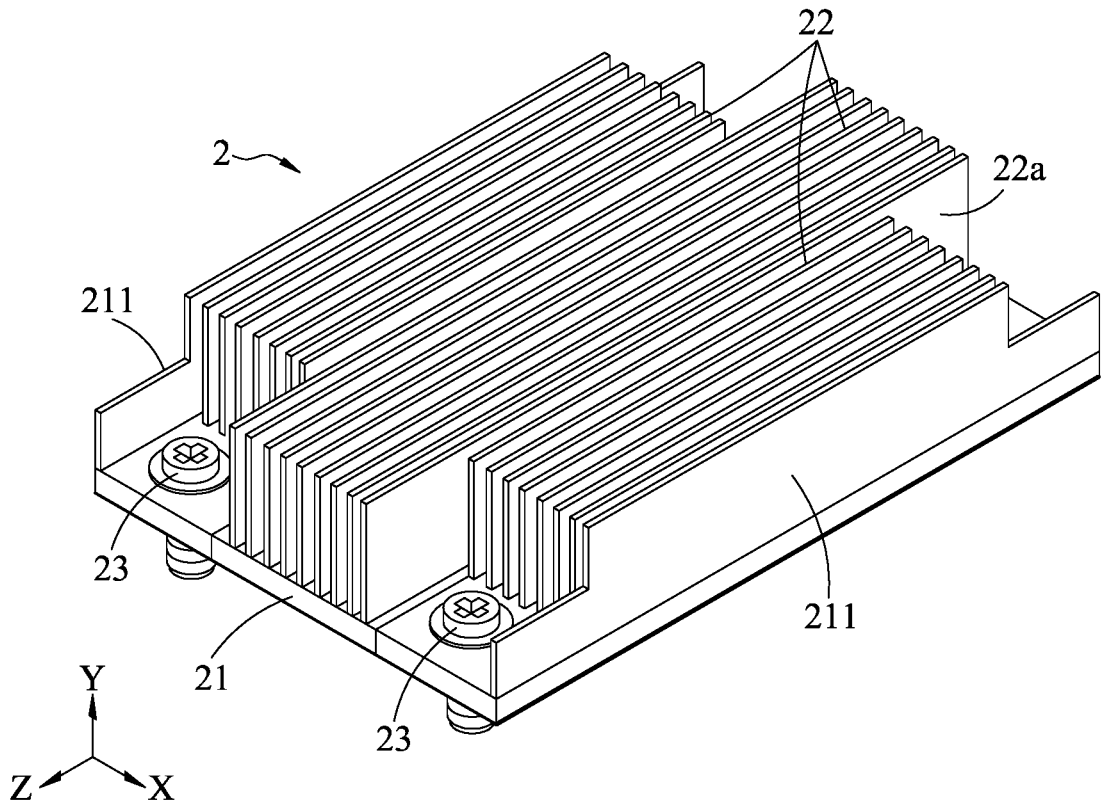
FIG. 3A illustrates a schematic outside view of a heat dissipation module according to some embodiments.
Figure 3B:
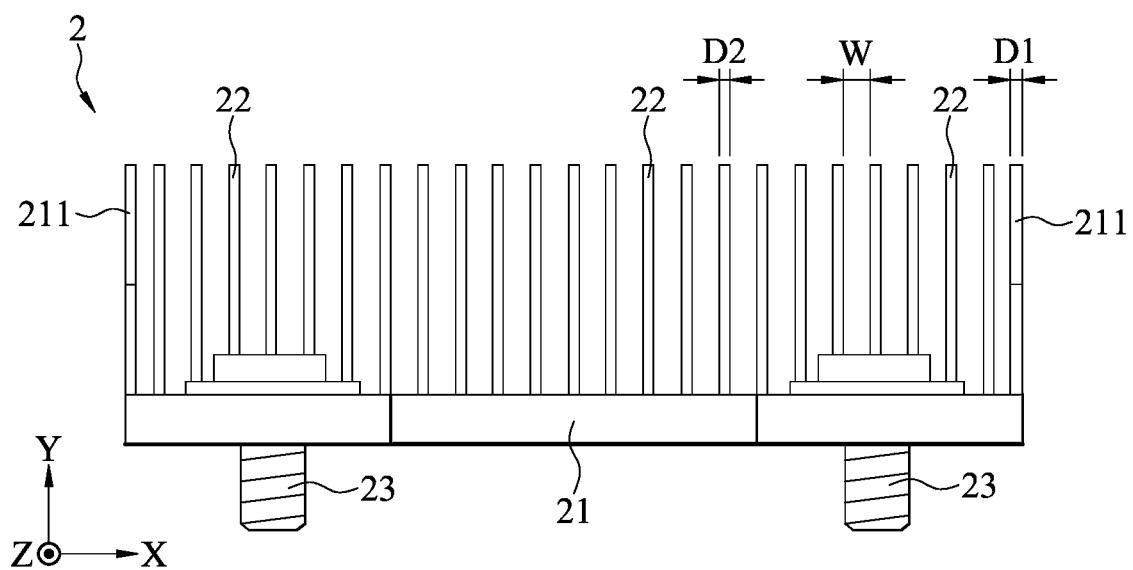
FIG. 3B illustrates a schematic front view of the heat dissipation module according to some embodiments.

Referring to FIG. 3A and FIG. 3B, FIG. 3A is a schematic outside view of the heat dissipation module 2, and FIG. 3B is a schematic front view of the heat dissipation module 2. In some embodiments, the heat dissipation module 2 includes a base 21 and a plurality of heat dissipation fins 22, where the heat dissipation fins 22 are disposed on the base 21. The base 21 includes a plurality of baffles 211, where the baffles 211 and the plurality of heat dissipation fins 22 coaxially (such as a Z-axis direction in FIG. 3A) extend into a rectangular sheet; and the baffles 211 are respectively located at two sides of the plurality of heat dissipation fins 22, and a thickness D1 of each baffle 211 is greater than a thickness D2 of each heat dissipation fin 22. When a heating test is performed on the heat dissipation module 2, the plurality of heat dissipation fins 22 present a bent state after being heated, and the plurality of heat dissipation fins 22 abut against the baffles 211. The baffles 211 are located at two sides of the plurality of heat dissipation fins 22, so that the heat dissipation fins 22 are limited between the baffles 211 when the heat dissipation fins 22 are bent, thereby ensuring that the plurality of heat dissipation fins 22 are in a normal upright state.

Referring to FIG. 3A and FIG. 3B, in some embodiments, the base 21 and the heat dissipation fins 22 may be an integrated one-piece member or two separate members. In some embodiments, the base 21 includes a plurality of locking members 23. The heat dissipation fins 22 are arranged on the base 21 in a cross shape. The locking members 23 are locked around the plurality of heat dissipation fins 22 and are fastened to a circuit board 6.

Figure 4A:
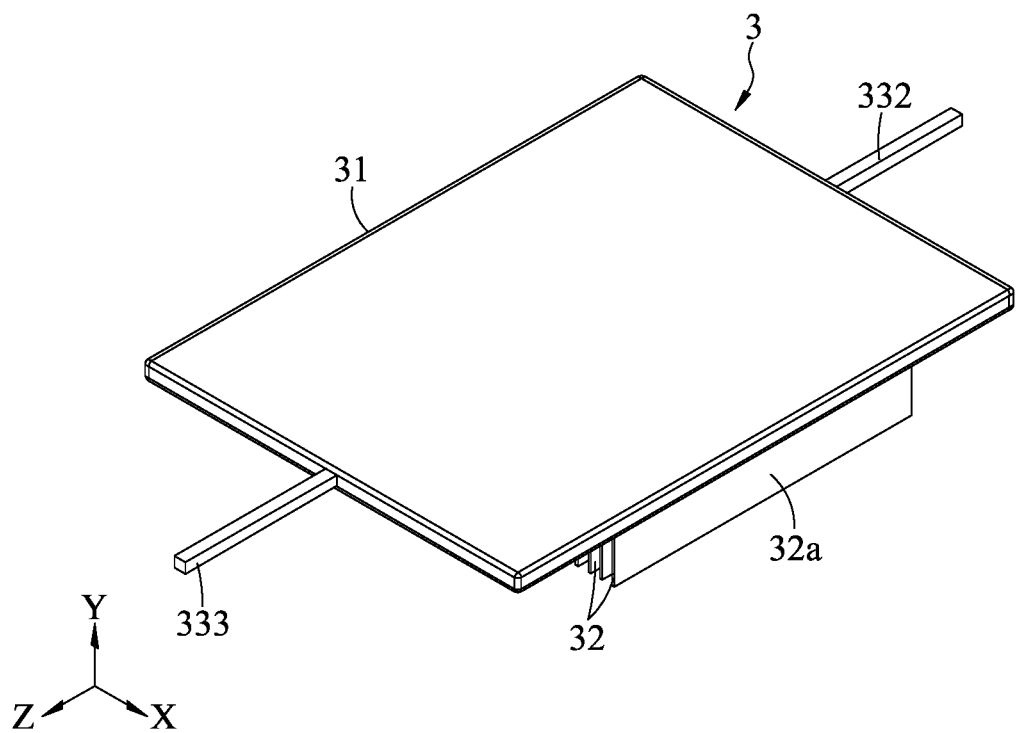
FIG. 4A illustrates a schematic outside view of a cooling module according to some embodiments.

Referring to FIG. 3A and FIG. 3B, in some embodiments, directions of a long side 22a of each heat dissipation fin 22 and a long side 32a (as shown in FIG. 4A) of each fin of the heat dissipation fin assembly 32 are parallel to a guiding direction (such as a flow direction indicated by an arrow shown in FIG. 6) of the heat transfer fluid 9. The heat transfer fluid 9 passes through between the heat dissipation fins 22 and between the fins of the heat dissipation fin assembly 32 in a forward direction. The heat dissipation fins 22 and the fins of the heat dissipation fin assembly 32 may each be in a shape of a rectangle, a trapezoid, or a square.

Referring to FIG. 3A and FIG. 3B, in some embodiments, a range of a thickness D2 of each of the heat dissipation fins 22 is 0.8 mm to 1.2 mm. A range of a distance W between the heat dissipation fins 22 is 2.8 mm to 3.6 mm. Heat dissipation fins used in conventional air cooling manners are mainly stacked fins, a conventional thickness of the heat dissipation fin 22 is 0.3 mm, a conventional distance between the heat dissipation fins 22 is less than 1.65 mm, and a material of the heat dissipation fins 22 is aluminum. Due to a highly viscous property of the heat transfer fluid 9, if a distance between heat dissipation fins 22 is too small, the heat transfer fluid 9 is unlikely to pass through between the heat dissipation fins 22. Heat dissipation fins 22 shown in FIG. 3B are spaced transversely and sequentially. If the distance W between the heat dissipation fins 22 is set to 3.2 mm, and the thickness D2 of each heat dissipation fin 22 is set to 1 mm, it helps the heat transfer fluid 9 to pass. In some embodiments, a material of the heat dissipation fins 22 is copper, so that heat energy be rapidly and evenly transferred to the heat transfer fluid 9.

Figure 4B:
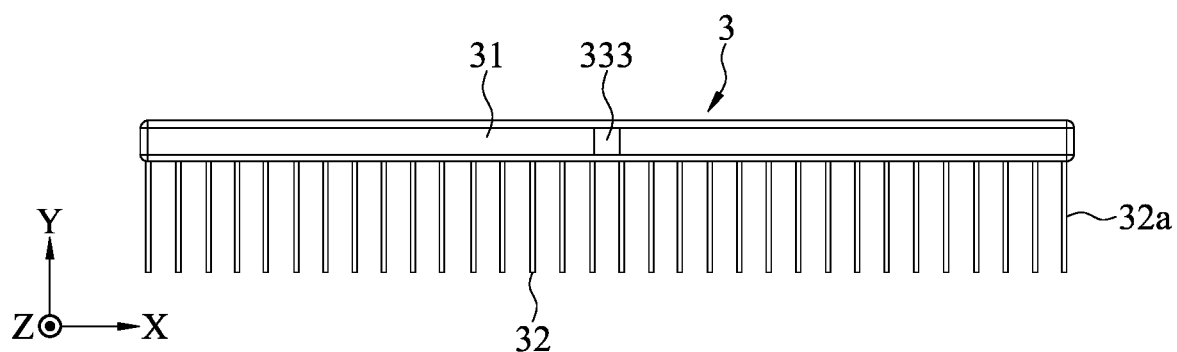
FIG. 4B illustrates a schematic front view of the cooling module according to some embodiments.
Figure 7:
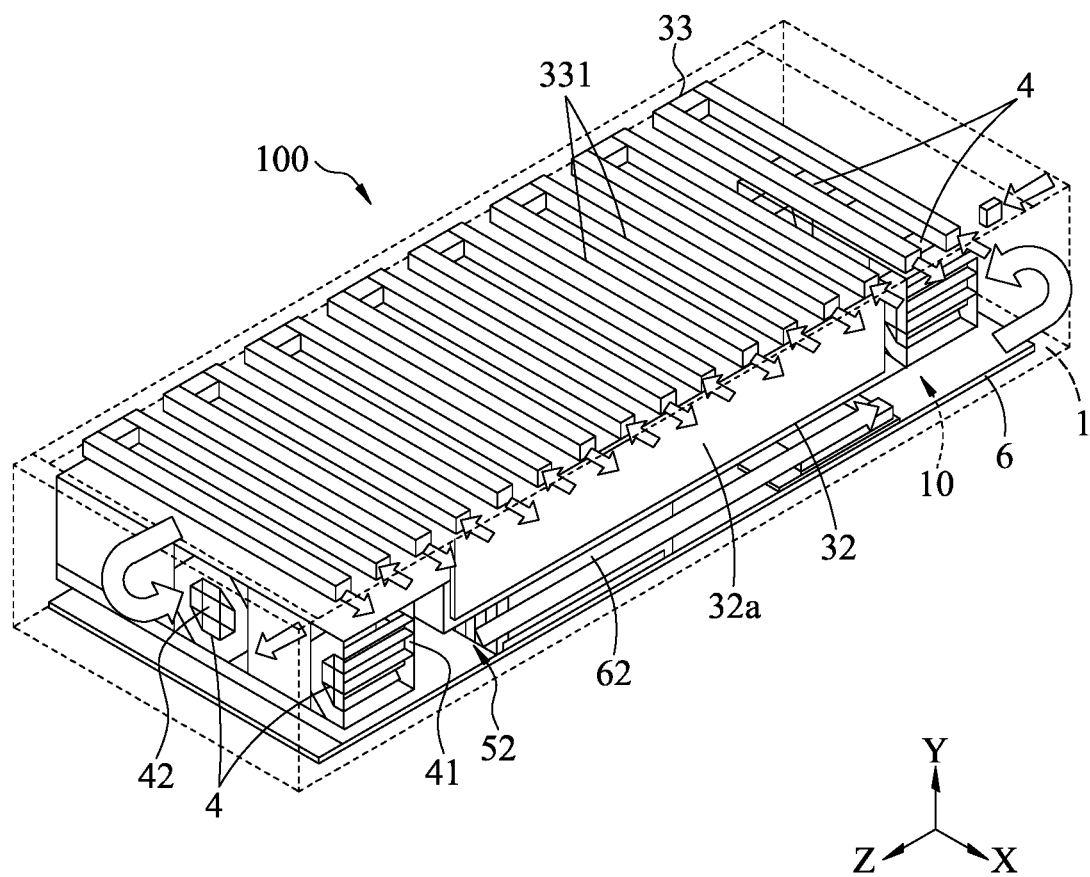
FIG. 7 illustrates a schematic three-dimensional cross-sectional view of a cooling system from the perspective of FIG. 1 according to some embodiments, where states of flow directions of heat transfer fluid and a cooling channel in a cover plate are indicated by arrows.

Referring to FIG. 4A and FIG. 4B, FIG. 4A is a schematic outside view of the cooling module 3, and FIG. 4B is a schematic front view of the cooling module 3. In some embodiments, a material of the cooling module 3 is copper or aluminum, the cooling channel 33 is a waterway channel. The cooling channel 33 includes a flow channel 331. The flow channel 331 is arranged in the cover plate 31 in a consecutive S-shaped manner. The inlet and the outlet are respectively located at two sides of the cover plate. The flow channel 331 may be a slot running through the cover plate 31 or a water pipe may be mounted in the slot. An inlet is a water inlet pipe 332 disposed at one side of the cover plate 31 and connected to the flow channel 331, and an outlet is a water outlet pipe 333 disposed at an other side of the cover plate 31 and connected to the flow channel 331. The present invention is not limited thereto. The water inlet pipe and the water outlet pipe may be disposed at any position of the cover plate 31 according to requirements. During heat exchange operation of the cooling module 3, it is seen from FIG. 6 that the heat transfer fluid 9 in the container 1 is sucked by the heat dissipation fin assembly 32 below the cover plate 31, and exchanges heat with water in the cooling channel 33 of the cover plate 31 (as shown in FIG. 7). In some embodiments, ordinary water may be injected into the cover plate 31, and the water enters from the water inlet pipe 332 and flows to the water outlet pipe 333 along the S-shaped flow channel 331 and out of the water outlet pipe 333. A temperature of the water entering the water inlet pipe 332 is about 35 degrees, and the water takes heat energy on the heat dissipation fin assembly 32 away toward the water outlet pipe 333 along the S-shaped flow channel 331.

Referring to FIG. 4A and FIG. 4B, in some embodiments, the cover plate 31 and the heat dissipation fin assembly 32 may be an integrated one-piece member or two separate members. One end of the heat dissipation fin assembly 32 is in contact with the cover plate 31, and an other end of the heat dissipation fin assembly 32 is mounted in the accommodating space 10 of the container 1 (as shown in FIG. 6). At least a part of the other end of the heat dissipation fin assembly 32 is immersed in the heat transfer fluid 9. In a case of a large volume of the heat transfer fluid 9, the heat dissipation fin assembly 32 is entirely immersed in the heat transfer fluid 9, or in a case of a small volume of the heat transfer fluid 9, at least a part of the heat dissipation fin assembly 32 is immersed in the heat transfer fluid 9.

Referring to FIG. 2, in some embodiments, the immersion cooling device 100 includes a plurality of fluid conveying devices 4 (or one fluid conveying device 4), where the fluid conveying devices 4 form two groups opposite to each other, and each of the two groups is used for a plurality of fluid conveying devices 4 (or the groups may each be used for one fluid conveying device 4). The plurality of fluid conveying devices 4 of the two groups are arranged at two sides of the inside of the container 1, outlets 41 of the fluid conveying devices 4 respectively face the heat dissipation module 2 and the heat dissipation fin assembly 32 (as shown in FIG. 6). Flow directions of fluid generated at the outlets 41 of the fluid conveying devices 4 are respectively conveying the fluid to the heat dissipation module 2 and the heat dissipation fin assembly 32. The fluid conveying devices 4 are forced to mix the heat transfer fluid 9, thereby improving heat transfer efficiency.

Referring to FIG. 2, in some embodiments, the immersion cooling device 100 further includes at least one fluid conveying device 4, where an outlet 41 of the fluid conveying device 4 faces the heat dissipation module 2. Fluid generated at the outlet 41 of the fluid conveying device 4 flows and is conveyed to the heat dissipation module 2. In some embodiments, the fluid conveying device 4 is a fan for liquid. One side of the fan is the outlet 41 where the fluid is discharged, and an other side of the fan is an inlet 42 where the fluid enters. During operation of the fan, blades in the fan rotate and drive the heat transfer fluid 9 to flow from the inlet 42 to the outlet 41, and the fluid generated at the outlet 41 of the fluid conveying device 4 flows and is conveyed to the heat dissipation module 2.

Referring to FIG. 2, FIG. 3A, and FIG. 3B, FIG. 3A is a schematic outside view of the heat dissipation module 2, and FIG. 3B is a schematic front view of the heat dissipation module 2. In some embodiments, the immersion cooling device 100 further includes a plurality of heat dissipation modules 2 (as shown at a left side of FIG. 1, two heat dissipation modules 2 are arranged on the left and right in an X-axis direction, but the present invention is not limited thereto, and there may alternatively be one heat dissipation module 2). The outlets 41 of the fluid conveying devices 4 at the left side of FIG. 1 respectively face the heat dissipation modules 2. The heat transfer fluid 9 generated at the outlets 41 of the fluid conveying devices 4 are guided to the heat dissipation modules 2.

In some embodiments, a quantity of the fluid conveying devices 4 corresponds to a quantity of the heat dissipation modules 2, but the present invention is not limited thereto. In some embodiments, the quantity of the fluid conveying devices 4 may be greater than or less than the quantity of the heat dissipation modules 2. In some embodiments, two fluid conveying devices 4 may form a group for use, for example, in a usage mode in which use of the middle fluid conveying device 4 in three fluid conveying devices 4 shown at the left side of FIG. 1 is omitted, and three fluid conveying devices 4 shown at a right side of FIG. 1 are omitted. In some embodiments, two fluid conveying devices 4 correspondingly face two heat dissipation modules 2 respectively, but the present invention is limited thereto. In some embodiments, two fluid conveying devices 4 may correspondingly face sides of two heat dissipation modules 2 respectively, and heat energy of the heat dissipation modules 2 is taken away through flowing of the fluid at the sides of the heat dissipation modules 2.

In some embodiments, three fluid conveying devices 4 may be used, for example, the three fluid conveying devices 4 shown at the left side of FIG. 1 are used, and the three fluid conveying devices 4 shown at the right side of FIG. 1 are omitted. The outlet 41 of the leftmost first fluid conveying device 4 shown at the left side of FIG. 1 and the outlet 41 of the rightmost second fluid conveying device 4 shown at the left side of FIG. 1 face the heat dissipation modules 2, the outlet 41 of the middle third fluid conveying device 4 shown at the left side of FIG. 1 faces between the heat dissipation modules 2, and fluid generated at the outlet 41 of the third fluid conveying device 4 flows and is conveyed to between the heat dissipation modules 2.

Referring to FIG. 1 and FIG. 2, in some embodiments, the immersion cooling device 100 further includes a circuit board 6 and a plurality of electronic components 61 (or at least one electronic component 61). The circuit board 6 is located in the container 1. The inside of the container 1 is a rectangular closed tank, and may be filled up with non-conductive heat transfer fluid 9 (as shown at a right side of FIG. 1, an inside of imaginary lines indicated by two-dot chain lines illustratively shows the heat transfer fluid 9). The circuit board 6 and the electronic components 61 are immersed in the heat transfer fluid 9. In some embodiments, the electronic components 61 are arranged at a left side of the circuit board 6 shown in FIG. 6 and are spaced along the X-axis direction. The present invention is not limited thereto. The electronic components 61 may be disposed at other positions of the circuit board 6 shown in FIG. 1. The electronic components 61 shown at the left side of FIG. 1 operate at high wattage, and a plurality of heat dissipation modules 2 are respectively combined above the electronic components 61 (as shown in FIG. 6) shown at the left side of FIG. 1, and are used for absorbing heat energy emitted by the electronic components 61. In some embodiments, the electronic components 61 are central processing units (CPU chips) with high heating wattage.

In some embodiments, the immersion cooling device 100 further includes an electronic part 63 (or a plurality of electronic parts 63). The electronic part 63 is disposed at a position on a right side of the circuit board 6 shown in FIG. 1. As shown in FIG. 6, fluid passing through the heat dissipation modules 2 flows and is conveyed to the electronic part 63, so that heat energy generated by the electronic part 63 is taken away by the fluid. In some embodiments, the electronic part 63 is a chipset or a switch. In some embodiments, the chipset is a platform controller hub.

In some embodiments, the circuit board 6 may be a finished product of an existing system. The circuit board 6 includes the electronic components 61 and the heat dissipation modules 2. The circuit board 6 of the current system is mounted in the accommodating space 10 of the container 1, then, the fluid conveying devices 4 and the guiding member 5 are mounted in the accommodating space 10 of the container 1, the accommodating space 10 of the container 1 is filled with the heat transfer fluid 9, the cooling module 3 is covered on the container 1, and all the components are completely assembled after the opening 11 of the container 1 is closed, leading to easy usage and fast integration. In some embodiments, the container 1 includes a cable exit (for example, a round hole is provided on the container 1 near number 9 of FIG. 1) for a transmission cable connected to the circuit board 6 pass through the cable exit. The transmission cable is used for transmitting power to the circuit board 6 for operation and/or the transmission cable is used for transmitting signals to link the circuit board 6 with an external device. In addition, a gasket or a waterproof adhesive may be additionally mounted between the transmission cable and the cable exit for seal, so that the inside of the container 1 is in an airtightly-closed state.

Figure 5:
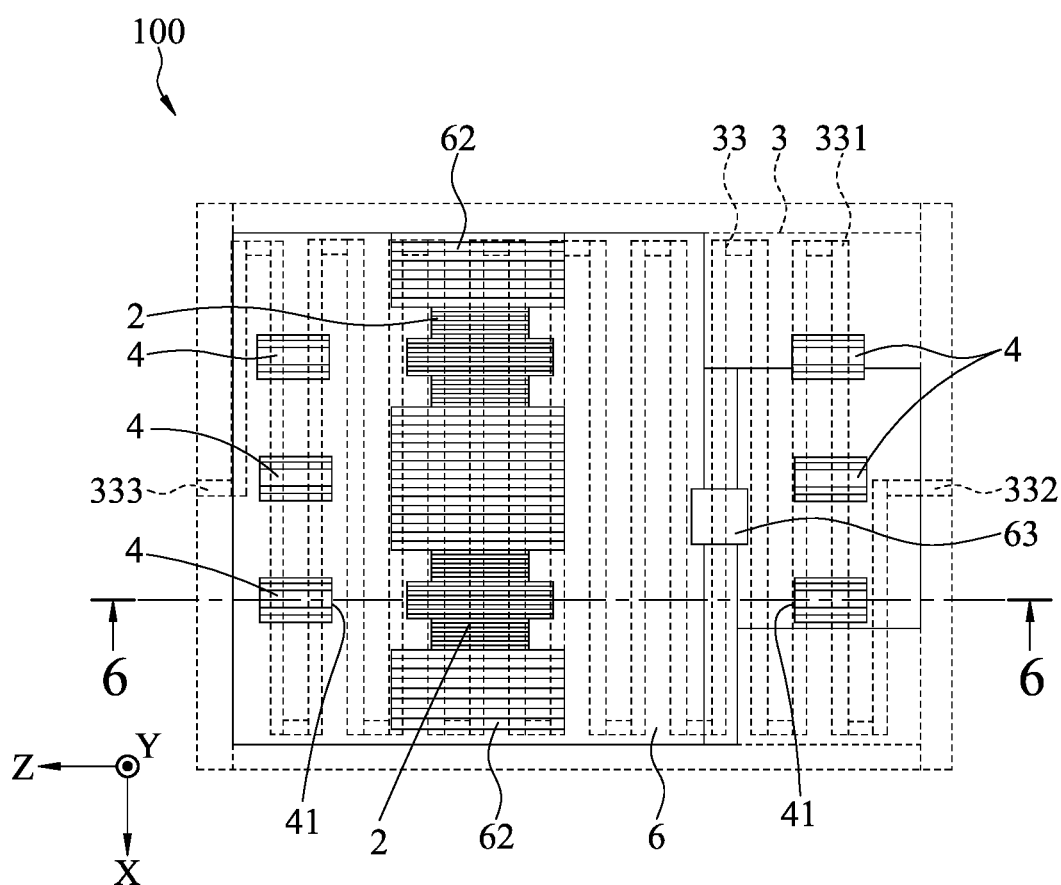
FIG. 5 illustrates a schematic top view of a cooling system according to some embodiments, where states of a circuit board, a heat dissipation module, and a fluid conveying device are represented by solid lines, and states of a container and a cooling module are represented by dashed lines.

Referring to FIG. 1 and FIG. 5, FIG. 5 is a schematic top view of the immersion cooling device 100, where states of the circuit board 6, the heat dissipation modules 2, and the fluid conveying devices 4 are represented by solid lines, and states of the container 1 and the cooling module 3 are represented by dashed lines. In some embodiments, the immersion cooling device 100 further includes a plurality of expansion components 62. The expansion components 62 are disposed on the circuit board 6 and are located at sides of the electronic components 61. The expansion components 62 are provided between the heat dissipation modules 2. In this embodiment, the expansion components 62 are dual in-line memory modules (DIMMs), but the present invention is not limited thereto. For example, the expansion components 62 may alternatively be display adapters or graphic cards. Outlets 41 of the fluid conveying devices 4 may face the expansion components 62, and fluid generated at an outlet 41 of the middle fluid conveying device 4 shown at the left side of FIG. 1 flows and is conveyed to the expansion components 62 between the heat dissipation modules 2, so that heat energy generated by the expansion components 62 is taken away by the fluid.

Referring to FIG. 2 and FIG. 6, FIG. 6 is a schematic cross-sectional side view of a position 6-6 shown in FIG. 5, where a circuit enclosed by imaginary lines indicated by two-dot chain lines shows local heat transfer fluid 9 in the container 1, and states of a flow direction of fluid generated by operation of the fluid conveying devices 4 and water inlet and outlet directions of the cover plate 31 are indicated by arrows. In some embodiments, the two groups of fluid conveying devices 4 located at two sides of the container 1 include 6 fluid conveying devices 4. Three fluid conveying devices 4 of the first group shown at a left side of FIG. 2 are located at one side of the inside of the container 1 and located at the bottom of the guiding member 5, and three fluid conveying devices 4 of the second group shown at a right side of FIG. 2 are located at an other side of the inside of the container 1 and located at the top of the guiding member 5.

Referring to FIG. 2 and FIG. 6, in some embodiments, the first group of fluid conveying devices 4 shown at the left side of FIG. 2 and the second group of fluid conveying devices 4 shown at the right side of FIG. 2 are arranged coaxially (such as an X-axis in FIG. 2) and in a parallel double-row form, there are three fluid conveying devices 4 in a single row of each group, and the three fluid conveying devices 4 in the same group are spaced from each other by a predetermined distance. It can be clearly seen from the top view shown in FIG. 5 that the six fluid conveying devices 4 in the double-row form are arranged coaxially (the outlets 41 of the fluid conveying devices 4 at a left side and a right side of FIG. 5 are arranged corresponding to each other), but the present invention is not limited thereto. The six fluid conveying devices 4 in the double-row form may alternatively be disposed non-coaxially, for example, one group of fluid conveying devices 4 are arranged in an X-axis in FIG. 5, and the other group of fluid conveying devices 4 are arranged in a non-X-axis (having an angle with the X-axis in FIG. 5) in FIG. 5.

Referring to FIG. 6, in some embodiments, fluid conveying devices 4 on the left and fluid conveying devices 4 on the right in FIG. 6 are not arranged at the same horizontal plane, but are arranged in a stagger manner. The fluid conveying devices 4 on the left are arranged on the circuit board 6 and are located below a guiding plate 51, and the fluid conveying devices 4 on the right are arranged above the guiding plate 51 and are adjacent to the cover plate 31. A manner in which the fluid conveying devices 4 on the left and the fluid conveying devices 4 on the right are staggered may be partially overlapping (for example, tops of the fluid conveying devices 4 on the left and bottoms of the fluid conveying devices 4 on the right in FIG. 6 are projected on a plane from a Z-axis direction to form overlapped images), or may be non-overlapping (for example, tops of fluid conveying devices 4 on the left and bottoms of fluid conveying devices 4 on the right in FIG. 8B are projected on a plane from the Z-axis direction to form non-overlapped images).

Referring to FIG. 2 and FIG. 6, in some embodiments, the immersion cooling device 100 further includes a guiding member 5, where the guiding member 5 is located in the container 1 and is used for guiding the heat transfer fluid 9 to the heat dissipation module 2.

Referring to FIG. 2 and FIG. 6, in some embodiments, the guiding member 5 includes a guiding plate 51 and two separated regions 52. The fluid conveying device 4 is positioned on the guiding plate 51. The guiding plate 51 separates the heat dissipation module 2 and the heat dissipation fin assembly 32. The heat dissipation module 2 and the heat dissipation fin assembly 32 are respectively located in the separated regions 52. The heat transfer fluid 9 in the separated regions 52 is conveyed in opposite flow directions (such as a flow direction P1 at the right side and a flow direction P2 at the left side in FIG. 6). As shown in FIG. 7, the heat transfer fluid 9 in an upper separated region 52 is conveyed to the left, and the heat transfer fluid 9 in a lower separated region 52 is conveyed to the right. In some embodiments, operating principle of heat exchange is that: the container 1 is divided into two, upper and lower layers by using the guiding plate 51 that divides a flow up and down. The fluid conveying device 4 at the lower layer conveys the heat transfer fluid 9 from left to right. The heat transfer fluid 9 passes through the electronic components 61 and transfers the heat energy of the electronic components 61 to the upper layer. The fluid conveying device 4 at the upper layer conveys the heat transfer fluid 9 from right to left, to make the heat energy absorbed by the heat dissipation fin assembly 32 located below the cover plate 31, and exchange heat with water in the cover plate 31, and the heat is taken away.

Referring to FIG. 2 and FIG. 7, FIG. 7 is a schematic three-dimensional cross-sectional view of the immersion cooling device 100 from the perspective of FIG. 1, where states of flow directions of the heat transfer fluid 9 and the cooling channel 33 in the cover plate 31 are indicated by arrows. In some embodiments, the guiding plate 51 covers sides of each fluid conveying device 4. When the fluid conveying device 4 is covered by the guiding plate 51, the fluid conveying device 4 expose the outlet 41 and the inlet 42. The guiding plate 51 is assembled in the container 1 to separate the container 1 into the separated regions 52 at the upper and lower two layers. The guiding plate 51 divides the heat transfer fluid 9 in the container 1 up and down, so that the heat transfer fluid 9 is better circulated and flows back less in the container 1.

Referring to FIG. 2, in some embodiments, the guiding plate 51 may be a whole horizontal flat plate arranged transversely. As shown in FIG. 4, long sides of the horizontal flat plate and a Z-axis are the same horizontal axis. The horizontal flat plate is transversely disposed in the container 1.

In some embodiments, the guiding plate 51 may be a whole inclined flat plate, for example, as shown in FIG. 6, the horizontal flat plate is rotated by a specific angle with the X-axis as a central axis, so that the guiding plate 51 represents an inclined flat plate. For example, the horizontal guiding plate 51 in FIG. 6 represents an inclined flat plate that or that is high on the right and low on the left or that is high on the left and low on the right. In some embodiments, the fluid conveying devices 4 are obliquely disposed on the inclined flat plate, and each fluid conveying devices 4 may generate an inclined flow direction of fluid, thereby broadening an application range of the inclined flow direction of the fluid.

Figure 9:
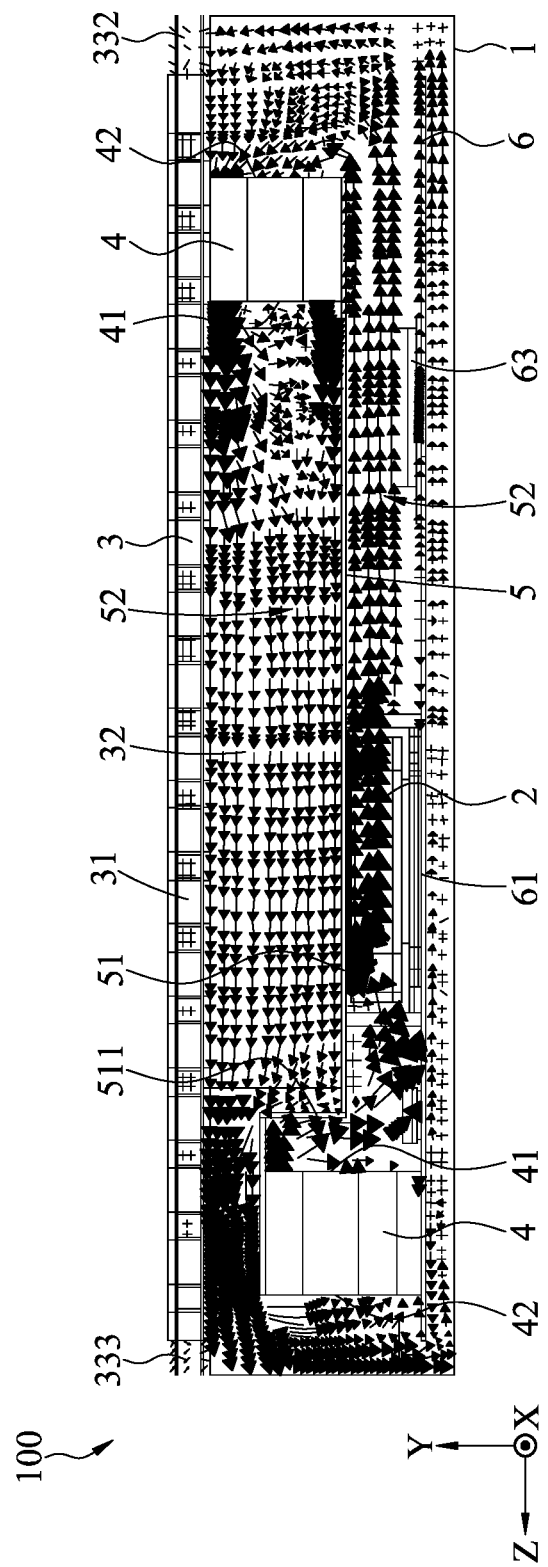
FIG. 9 illustrates a schematic cross-sectional side view of a cooling system from the perspective of FIG. 6 according to some embodiments, which shows a state of a flow direction of heat transfer fluid when a guiding plate is mounted.

Referring to FIG. 6, in some embodiments, the guiding plate 51 includes a turning portion 511. The turning portion 511 is adjacently located at the outlet 41 of the fluid conveying device 4. As shown in FIG. 6, an overall side view of the guiding plate 51 is generally stepped. A small horizontal plane on the upper left of the guiding plate 51 and a large horizontal plane on the lower right of the guiding plate 51 are located on different horizontal planes by the turning portion 511. When the fluid generated by the fluid conveying device 4 flows to the turning portion 511, the heat transfer fluid 9 may turn at the turning portion 511, and then flow to the heat dissipation module 2 after changing the flow direction. A plurality of arrow patterns at the turning portion 511 shown in FIG. 9 are in a densely accumulated state, and a speed of the heat transfer fluid 9 at the turning portion 511 becomes slow.

Referring to FIG. 6, in some embodiments, the turning portion 511 is an upright flat plate 511a. A direction of the upright flat plate 511a is the same as a Y-axis direction. The upright flat plate 511a is parallel to a surface of the outlet 41 of the fluid conveying device 4. When the flow direction of the heat transfer fluid 9 generated by the fluid conveying device 4 is to the upright flat plate 511a, the upright flat plate 511a is perpendicular to the flow direction of the heat transfer fluid 9 and blocks the flow direction, and the heat transfer fluid 9 may turn at the upright flat plate 511a and then flow to the heat dissipation module 2 after changing the flow direction.

Referring to FIG. 8A, FIG. 8A is a schematic cross-sectional side view of the immersion cooling device 100 from the perspective of FIG. 6, which shows a state in which the turning portion 511 of the guiding plate 51 is an inclined plate. In some embodiments, the turning portion 511 is an inclined flat plate 511b. There is an angle θ1 between the inclined flat plate 511b and a surface of the fluid conveying device 4. The angle θ1 is less than 90 degrees. As shown in FIG. 8A, the angle θ1 of the inclined flat plate 511b at a left side may be set according to requirements, for example, a position of the fluid conveying device 4 is changed. As shown in FIG. 8A, a distance between the fluid conveying device 4 on the left and the heat dissipation module 2 is longer, and the angle θ1 may be reduced to less than 60 degrees, thereby helping guiding and conveying of the fluid. For example, a volume of the fluid conveying device 4 is changed (for example, the fluid conveying devices 4 of FIG. 8A and FIG. 8C have larger volumes, and the fluid conveying devices 4 of FIG. 8B and FIG. 8D have smaller volumes), the larger volume of the fluid conveying device 4 on the left of FIG. 8A is changed to the smaller volume of the fluid conveying device 4 on left of FIG. 8B. Most of fluid generated by the fluid conveying device 4 on the left of FIG. 8A may be aligned with the heat dissipation module 2 for conveying, and a small part of the fluid generated by the fluid conveying device 4 on the left needs to pass through the inclined flat plate 511b to be turned and conveyed to the heat dissipation module 2. The angle θ1 of the inclined flat plate 511b may be increased to close to 90 degrees, thereby helping the guiding and conveying of the fluid.

Referring to FIG. 8C, FIG. 8C is a schematic cross-sectional side view of the immersion cooling device 100 from the perspective of FIG. 6, which shows a state in which a plurality of guiding plates 51 are the inclined flat plates 511b. In some embodiments, the guiding member 5 includes a plurality of guiding plates 51. The guiding plate 51 is small inclined flat plates 511b. The inclined flat plates 511b are adjacently located at the outlets 41 of the fluid conveying devices 4 respectively. The inclined flat plates 511b are used for respectively guiding the heat transfer fluid 9 conveyed by the fluid conveying devices 4 to the heat dissipation modules 2 and the heat dissipation fin assembly 32. There are angles θ2 or θ3 between the inclined flat plates 511b and surfaces of the fluid conveying devices 4 respectively. The angles θ2 or θ3 are less than 90 degrees. The left angle θ2 shown in FIG. 8C is less than the right angle θ3 shown in FIG. 8C. As shown in FIG. 8C, the angle θ2 of the inclined flat plate 511b at a left side may be set according to requirements, for example, the position of the fluid conveying device 4 is changed. For example, a distance between the fluid conveying device 4 on the left and the heat dissipation module 2 in FIG. 8C is longer, and the angle θ2 may be reduced to less than 60 degrees, thereby helping guiding and conveying of the fluid. For example, as shown in FIG. 8C, the angle θ3 of the inclined flat plate 511b at a right side may be set according to the requirements, for example, the position of the fluid conveying device 4 is changed. For example, the distance between the fluid conveying device 4 on the left and the heat dissipation module 2 in FIG. 8C is shorter, and the angle θ3 may be increased to close to 90 degrees, thereby helping the guiding and conveying of the fluid.

In some embodiments, the angle θ2 of the guiding plate 51 at the left side of FIG. 8C and the angle θ3 of the guiding plate 51 at the right side of FIG. 8C may be the same or different. The angle θ2 of the guiding plate 51 at the left side of FIG. 8C may be set according to the requirements. For example, when the position or the volume of the fluid conveying device 4 is changed or a position or a volume of the heat dissipation module 2 is changed, the guiding plate 51 may further change the angle of the angle θ2, so that the flow direction of the fluid generated at the outlet 41 of the fluid conveying device 4 may be guided to the heat dissipation module 2 along the guiding plate 51. The angle θ3 of the guiding plate 51 at the right side of FIG. 8C may be set according to the requirements, for example, when the position or the volume of the fluid conveying device 4 is changed or the position or the volume of the heat dissipation module 2 is changed, the guiding plate 51 may further change the angle of the angle θ3, so that the flow direction of the fluid generated at the outlet 41 of the fluid conveying device 4 may be guided to the heat dissipation fin assembly 32 along the guiding plate 51.

In some embodiments, the guiding member 5 includes at least one guiding plate 51 (for example, the guiding plate 51 at the right side of FIG. 8C is omitted, and the guiding plate 51 at the left side is retained). The guiding plate 51 is a small inclined flat plate 511b, and is disposed corresponding to an outlet 41 of a fluid conveying device 4, and the inclined flat plate 511b is used for respectively guiding the heat transfer fluid 9 conveyed by the fluid conveying devices 4 to the heat dissipation modules 2. There is an angle θ2 between the inclined flat plate 511b and a surface of the fluid conveying device 4, and the angle θ2 is less than 90 degrees.

In some embodiments, when the guiding plate 51 of the guiding member 5 is mounted in the container 1, the fluid conveying devices 4 at a left side and a right side of FIG. 9 make the heat transfer fluid 9 in the container 1 flow at different layers, so that the heat transfer fluid 9 separately flows above and below the guiding plate 51 and is circulated counterclockwise. The heat transfer fluid 9 conveyed by the fluid conveying device 4 on the left in FIG. 9 may pass through the guiding plate 51 to flow below the guiding plate 51, the heat transfer fluid 9 may pass through the heat dissipation module 2 and then is sucked by the fluid conveying device 4 at the right side of FIG. 9, to help the heat energy of the electronic component 61 and the electronic part 63 with high wattage to be brought to the upper heat dissipation fin assembly 32, and then the heat is taken away by using the water in the cooling channel 33 of the upper cover plate 31. A streamwise velocity of the heat transfer fluid 9 closer to the fluid conveying device 4 is higher, and a streamwise velocity of the heat transfer fluid 9 farther away from the fluid conveying device 4 is lower. The fluid conveying device 4 on the left in FIG. 9 conveys the heat transfer fluid 9 from left to right, and the fluid conveying device 4 on the right in FIG. 9 conveys the heat transfer fluid 9 from right to left. The guiding plate 51 divides the heat transfer fluid 9, so that the heat transfer fluid 9 effectively enters the heat dissipation module 2 and takes the heat energy of the heat dissipation module 2 away, and the heat transfer fluid 9 effectively enters the heat dissipation fin assembly 32 for the cover plate 31 to take the heat energy away. In some embodiments, a temperature of the electronic component 61 (CPU) is about 54 degrees (Tc). An ambient temperature near the electronic component 61 is about 40.5 degrees (Ta). Temperatures of the separated regions 52 above and below the guiding plate 51 is about 40.5 to 40.6 degrees. Wattage of the electronic component 61 is 350 watts (W). Thermal resistance (R) of the heat dissipation module 2 is 0.039 (C/W). A formula is: R=Tc−Ta/W(C/W).

Figure 10:
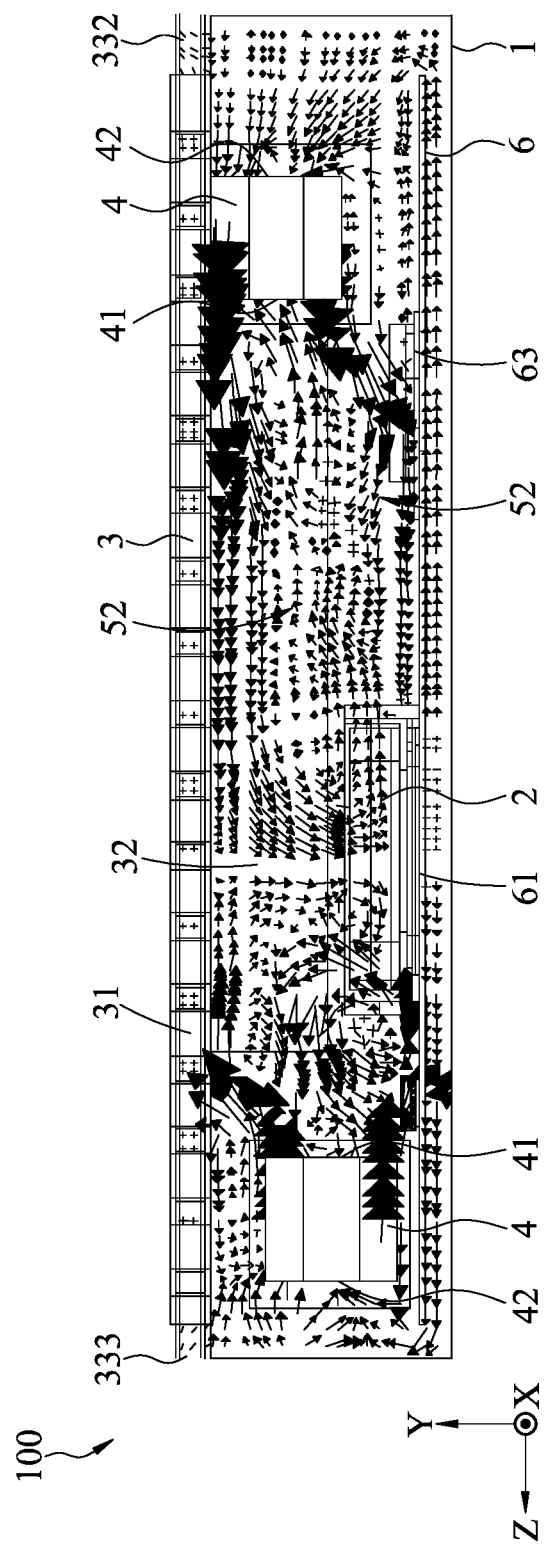
FIG. 10 illustrates a schematic cross-sectional side view of a cooling system from the perspective of FIG. 6 according to some embodiments, which shows a state of a flow direction of heat transfer fluid when no guiding plate is mounted.

Referring to FIG. 8D, FIG. 8D is a schematic cross-sectional side view of the immersion cooling device 100 from the perspective of FIG. 6, which shows a state in which no guiding plate 51 is used. In some embodiments, the guiding plate 51 of the guiding member 5 may not be mounted and disposed in the container 1. When the guiding plate 51 is omitted, the fluid conveying device 4 may be fixed to a predetermined position in the container 1 by a fixing structure such as a bracket. During operation of the fluid conveying devices 4, the fluid conveying devices 4 at a left side and a right side of FIG. 10 make the flow direction of the heat transfer fluid 9 in the container 1 generate disturbance and cause circulation or backflow, which helps to bring the heat energy of the electronic component 61 with high wattage to the upper heat dissipation fin assembly 32, and then the heat is taken away by using the water in the cooling channel 33 of the upper cover plate 31. A streamwise velocity of the heat transfer fluid 9 closer to the fluid conveying device 4 is higher, and a streamwise velocity of the heat transfer fluid 10 farther away from the fluid conveying device 4 is lower. The fluid conveying device 4 on the left in FIG. 10 conveys the heat transfer fluid 9 from left to right, and the fluid conveying device 4 on the right in FIG. 10 conveys the heat transfer fluid 9 from right to left, so that the heat transfer fluid 9 collides near the middle of the inside of the container 1 and flows back. In some embodiments, a temperature of the electronic component 61 (CPU) is about 60 degrees (Tc). An ambient temperature near the electronic component 61 is about 41.1 degrees (Ta). A temperature of each part in the container 1 is about 41.1 to 41.2 degrees. Wattage of the electronic component 61 is 350 watts (W). Thermal resistance (R) of the heat dissipation module 2 is 0.054 (C/W). A formula is: R=Tc−Ta/W(C/W).

In some embodiments, the circuit board 6 includes a plurality of electronic components 61, an electronic part 63, and other heating components. Heat sources in the container 1 have a total of 1000 watts (W) of heat energy. A temperature in the container 1 without the guiding plate 51 can be effectively reduced. The temperature in the container 1 with the guiding plate 51 can be reduced more effectively. The temperature of the electronic component 61 (CPU) drops by about 31%, and the thermal resistance drops by about 28%.

In some embodiments, thermal resistance of the heat dissipation module 2 in the conventional air cooling manner is 0.137 (C/W). When the thermal resistance of 0.054 (C/W) of the heat dissipation module 2 without a guiding plate 51 is compared with thermal resistance of 0.039 (C/W) of the heat dissipation module 2 with a guiding plate 51, the thermal resistance of the heat dissipation module 2 without a guiding plate 51 is 60.6%, and the thermal resistance of the heat dissipation module 2 with a guiding plate 51 is improved to 71.5%.

In some embodiments, a height of a standard server is in a unit of U (1 U equals 1.75 inches and 44.45 mm), and a case capacity of a 1 U server is about 15.7 L. However, a usage amount of the heat transfer fluid 9 is reduced in the container 1 of the immersion cooling device 100, the heat transfer fluid 9 exchanges heat with air or water without passing through the outside of the container 1. Therefore, the usage amount of the heat transfer fluid 9 in the container 1 may be relatively reduced compared to the usage amount of the conventional manner in which the heat transfer fluid 9 needs to be conveyed to the outside of the container 1. Therefore, heat exchange circulation is not performed the outside the container 1, a usage amount of heat transfer fluid 9 that needs to pass through a coolant distribution unit (CDU) and that is required in a manifold in the conventional manner may be reduced, and the usage amount is about 30 liters (L). Generally, a price of the heat transfer fluid 9 is about 180 (USD/L), and the immersion cooling device 100 may save about 5400 USD (180 times 30), that is, may save about 65.7% of costs.

In conclusion, according to some embodiments, the cooling module covers the opening of the container, the heat transfer fluid exchanges heat in the container through the cover plate and the heat dissipation fin assembly of the cooling module, and the heat transfer fluid exchanges heat with air or water without passing through the outside of the container. Therefore, a usage amount of the heat transfer fluid in the container can be relatively reduced compared to a usage amount of the conventional manner in which the heat transfer fluid needs to be conveyed to the outside of the container.

What is claimed is:

1. A cooling system, comprising:
 a container, comprising an opening;
 a heat transfer fluid, located in the container;
 a guiding member, located in the container and comprising:
  a guiding plate, wherein the guiding plate divides the inside of the container into two separated regions;
 a heat dissipation module, located in the container; and
 a cooling module, comprising:
  a cover plate, wherein the cover plate covers the opening, the cover plate comprises a cooling channel, the cooling channel is arranged in the cover plate, the cooling channel comprises an inlet and an outlet; and
  a heat dissipation fin assembly, wherein one side of the heat dissipation fin assembly is in contact with the cover plate, and an other side of the heat dissipation fin assembly is located in the container, wherein
 the heat dissipation module and the heat dissipation fin assembly are respectively located in the separated regions, and the heat transfer fluid in the separated regions is conveyed in opposite flow directions.

2. The cooling system according to claim 1, further comprising a fluid conveying device, wherein an outlet of the fluid conveying device faces the heat dissipation module, and fluid generated at the outlet of the fluid conveying device flows to the heat dissipation module.

3. The cooling system according to claim 2, wherein the fluid conveying device is positioned on the guiding plate, and the guiding plate separate the heat dissipation module and the heat dissipation fin assembly.

4. The cooling system according to claim 3, further comprising a plurality of fluid conveying devices, wherein the fluid conveying devices form two groups opposite to each other and are arranged at two sides of the inside of the container, outlets of the fluid conveying devices face the heat dissipation module and the heat dissipation fin assembly respectively, and flow directions of fluid generated at the outlets of the fluid conveying devices are respectively conveying the fluid to the heat dissipation module and the heat dissipation fin assembly.

5. The cooling system according to claim 4, further comprising a plurality of heat dissipation modules, wherein the outlets of the fluid conveying devices respectively face the heat dissipation modules, and the heat transfer fluid is guided to the heat dissipation modules.

6. The cooling system according to claim 4, wherein the guiding member comprises a plurality of guiding plates, the guiding plates are adjacently located at the outlets of the fluid conveying devices respectively, the guiding plates are used for respectively guiding the heat transfer fluid conveyed by the fluid conveying devices to the heat dissipation module and the heat dissipation fin assembly, the guiding plates each are an inclined flat plate, there is an angle between each of the inclined flat plates and a surface of each of the fluid conveying devices, each of the angles is less than 90 degrees, and the angles of the guiding plates are the same or different.

7. The cooling system according to claim 6, further comprising a circuit board and a plurality of electronic components, wherein the electronic components are disposed on the circuit board, the circuit board is located in the container, and the heat dissipation module are respectively combined with the electronic components.

8. The cooling system according to claim 2, wherein the guiding plate comprises a turning portion, and the turning portion is adjacently located at the outlet of the fluid conveying device.

9. The cooling system according to claim 8, wherein the turning portion is an upright flat plate, and the upright flat plate is parallel to a surface of the fluid conveying device; or the turning portion is an inclined flat plate, there is an angle between the inclined flat plate and the surface of the fluid conveying device, and the angle is less than 90 degrees.

10. The cooling system according to claim 2, further comprising a circuit board and a CPU (central processing unit), wherein the CPU is disposed on the circuit board, the circuit board is located in the container, and the heat dissipation module is combined with the CPU.

11. The cooling system according to claim 10, further comprising a plurality of expansion components, wherein the expansion components are disposed on the circuit board and are located at sides of the CPU.

12. The cooling system according to claim 10, wherein the heat dissipation module comprises a base and a plurality of heat dissipation fins, the heat dissipation fins are located on the base, the base comprises a plurality of baffles, the baffles is respectively located at two sides of the heat dissipation fins, a thickness of each of the baffles is greater than a thickness of each of the heat dissipation fins, and the base and the heat dissipation fins are an integrated one-piece member or two separate members.

13. The cooling system according to claim 12, wherein the base comprises a plurality of locking members, the heat dissipation fins are arranged on the base in a cross shape, and the locking members are locked around the heat dissipation fins and are fastened to the circuit board.

14. The cooling system according to claim 12, wherein a range of a thickness of each of the heat dissipation fins is 0.8 mm to 1.2 mm, and a range of a distance between the heat dissipation fins is 2.8 mm to 3.6 mm.

15. The cooling system according to claim 12, wherein directions of a long side of each of the heat dissipation fins and a long side of the heat dissipation fin assembly are parallel to a guiding direction of the heat transfer fluid, and the heat transfer fluid passes through between the heat dissipation fins and the heat dissipation fin assembly in a forward direction.

16. The cooling system according to claim 2, wherein the cooling channel comprises a flow channel, the flow channel is disposed in the cover plate in a consecutive S-shaped manner, the inlet and the outlet are respectively located at two sides of the cover plate, the inlet is located at one side of the cover plate and connected to the flow channel, and the outlet is located at an other side of the cover plate and connected to the flow channel.

17. A cooling device, applicable to accommodate a heat transfer fluid, the cooling device comprising:
a container, comprising an opening, wherein the heat transfer fluid is located in the container;
a guiding member, located in the container and comprising:
a guiding plate, wherein the guiding plate divides the inside of the container into two separated regions;
a heat dissipation module, located in the container; and
a cooling module, comprising:
a cover plate, wherein the cover plate covers the opening, the cover plate comprises a cooling channel, the cooling channel is arranged in the cover plate, the cooling channel comprises an inlet and an outlet; and
a heat dissipation fin assembly, wherein one side of the heat dissipation fin assembly is in contact with the cover plate, and an other side of the heat dissipation fin assembly is located in the container, wherein
the heat dissipation module and the heat dissipation fin assembly are respectively located in the separated regions, and the heat transfer fluid in the separated regions is conveyed in opposite flow directions.

18. The cooling device according to claim 17, further comprising a fluid conveying device, wherein an outlet of the fluid conveying device faces the heat dissipation module, and fluid generated at the outlet of the fluid conveying device flows to the heat dissipation module.

19. The cooling device according to claim 18, wherein the fluid conveying device is positioned on the guiding plate, and the guiding plate separate the heat dissipation module and the heat dissipation fin assembly.

20. The cooling device according to claim 18, wherein the guiding plate comprises a turning portion, and the turning portion is adjacently located at the outlet of the fluid conveying device.

* * * * *